United States Patent
Yin et al.

(10) Patent No.: US 7,328,416 B1
(45) Date of Patent: Feb. 5, 2008

(54) METHOD AND SYSTEM FOR TIMING MODELING FOR CUSTOM CIRCUIT BLOCKS

(75) Inventors: Ming Yin, Hayward, CA (US); Toshinari Takayanagi, San Jose, CA (US); Alan Smith, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 403 days.

(21) Appl. No.: 11/042,043

(22) Filed: Jan. 24, 2005

(51) Int. Cl.
*G06F 17/50* (2006.01)

(52) U.S. Cl. .............................. 716/6; 716/10; 716/13; 703/16

(58) Field of Classification Search .................... 716/6, 716/10, 13; 703/16
See application file for complete search history.

(56) References Cited

U.S. PATENT DOCUMENTS

| | | | |
|---|---|---|---|
| 5,452,239 A * | 9/1995 | Dai et al. ...................... 703/19 |
| 6,173,432 B1 * | 1/2001 | Harrison ......................... 716/1 |
| 6,367,060 B1 * | 4/2002 | Cheng et al. .................. 716/10 |
| 6,397,374 B1 * | 5/2002 | Pasqualini ..................... 716/8 |
| 6,564,360 B2 * | 5/2003 | Chiu .............................. 716/6 |
| 6,637,011 B1 * | 10/2003 | Zolotykh et al. ............... 716/3 |
| 6,684,373 B1 * | 1/2004 | Bodine et al. ................. 716/6 |
| 6,754,877 B1 * | 6/2004 | Srinivasan ..................... 716/2 |
| 6,996,515 B1 * | 2/2006 | Foltin et al. .................. 703/19 |
| 7,031,864 B2 * | 4/2006 | Matsui ....................... 702/117 |
| 7,073,153 B2 * | 7/2006 | Ikeda et al. ................... 716/13 |
| 7,111,259 B2 * | 9/2006 | Casavant ....................... 716/6 |
| 7,222,311 B2 * | 5/2007 | Kaufman et al. ............... 716/2 |
| 7,231,620 B2 * | 6/2007 | Jang et al. ..................... 716/6 |
| 7,239,997 B2 * | 7/2007 | Yonezawa ..................... 703/19 |
| 2001/0021990 A1 * | 9/2001 | Takeoka et al. ............... 716/1 |
| 2002/0073385 A1 * | 6/2002 | Slawecki ....................... 716/4 |
| 2002/0133795 A1 * | 9/2002 | Yamada ......................... 716/4 |
| 2003/0014724 A1 * | 1/2003 | Kojima et al. ................ 716/10 |

(Continued)

FOREIGN PATENT DOCUMENTS

| | | |
|---|---|---|
| JP | 2001117956 A * | 4/2001 |
| JP | 2001141788 A * | 5/2001 |
| WO | WO 2003052643 A1 * | 6/2003 |

OTHER PUBLICATIONS

NN9503639, "Tuning Path Delays for Synchronous Clocking", IBM Technical Disclosure Bulletin, vol. 38, No. 3, Mar. 1995, pp. 639-640 (5 pages).*

*Primary Examiner*—Phallaka Kik
(74) *Attorney, Agent, or Firm*—Martine Penilla & Gencarella, LLP

(57) ABSTRACT

A method is provided for modeling timing characteristics of a circuit block of an integrated circuit, which includes a main circuit and a timing circuit. The method comprises determining an output pin output delay and determining a timing circuit delay. The output pin output delay is an interval of time from a clock signal reaching a clock reference point (CRP) to an output signal arriving at the output pin. The clock reference point is positioned between the timing circuit and the main circuit. The timing circuit delay is an interval of time from a clock signal arriving at a clock input pin to a clock signal arriving at the CRP. The determination of the timing circuit delay is based on a computer simulation of a netlist of circuit elements in the timing circuit.

18 Claims, 3 Drawing Sheets

U.S. PATENT DOCUMENTS

| | | | |
|---|---|---|---|
| 2003/0110462 A1* | 6/2003 | Cohn et al. | 716/6 |
| 2003/0177455 A1* | 9/2003 | Kaufman et al. | 716/2 |
| 2004/0044979 A1* | 3/2004 | Aji et al. | 716/13 |
| 2004/0210857 A1* | 10/2004 | Srinivasan | 716/2 |
| 2004/0216066 A1* | 10/2004 | Chaudhari | 716/8 |
| 2004/0225991 A1* | 11/2004 | Fitzhenry et al. | 716/13 |
| 2005/0050497 A1* | 3/2005 | Tetelbaum | 716/6 |
| 2005/0102643 A1* | 5/2005 | Hou et al. | 716/6 |
| 2005/0149895 A1* | 7/2005 | Toubou | 716/6 |
| 2005/0188340 A1* | 8/2005 | Takeoka | 716/13 |
| 2006/0015831 A1* | 1/2006 | Varshney et al. | 716/4 |
| 2006/0064658 A1* | 3/2006 | Minonne et al. | 716/6 |
| 2006/0123281 A1* | 6/2006 | Lung Ko | 714/718 |
| 2006/0150133 A1* | 7/2006 | Abbaspour et al. | 716/6 |
| 2006/0190886 A1* | 8/2006 | Lu et al. | 716/6 |

* cited by examiner

METHOD AND SYSTEM FOR TIMING MODELING FOR CUSTOM CIRCUIT BLOCKS

BACKGROUND OF THE INVENTION

1. Field of the Invention

The present invention relates generally to a method for modeling signal timing in custom circuit blocks for microprocessors.

2. Description of the Related Art

With increasing demand for more complexity and higher throughput from integrated circuits (IC's), there is an increased need for designers to completely understand the timing characteristics of the circuitry being designed into the IC and how that timing affects other subcircuits being designed into the IC. Further, because of shorter product life cycles, there is an increasing desire to have a product enter the marketplace quickly.

ICs vary in their level of complexity depending upon the operations they are designed to perform. Complex ICs, e.g., microprocessors, are typically built up using a plurality of circuit blocks, each designed to perform a subset of the tasks performed by the entire IC. Each block has design characteristics that are not only critical to its own operation, but also to the operation of the entire IC. The timing of operations performed within each block and the delay times for a signal moving from one block to another block are critical and must be carefully considered during the design phase so that information required by any given block is made available by a preceding block, prior to any operation requiring that information being initiated.

By analyzing timing information for each block and for each interconnect connecting various circuit blocks together, any critical paths caused by a particular design of an IC may be determined. A critical path is a path having a first block preceding a second block in a data flow, the second block depending on data provided from the first block, wherein that data is not provided by the first block in a timely manner. After determining if critical paths exist in a given design, designers can make design improvements to ensure that the design will operate as planned, such as by maximizing the speed with which operations in the first block are performed.

Each time it is necessary to determine the timing of signals within an IC, data relating to the design of the individual circuits within the IC are analyzed, such as input capacitance, delay arc, driver characteristics, and net list. Typically one timing model for each block is prepared, together with layout files which contain connectivity information as to how each block is linked to each other block, and other information regarding the delays associated with transmitting information along a given interconnect from one block to another. These files are then provided as input data to a timing analyzer which, using constraints for that particular design, determines whether all blocks will function according to the design parameters set forth by the designers. The output of the timing analyzer includes the identification of any critical paths that must be fixed in order for the IC to function properly.

Thus, the importance of accurately modeling the timing characteristics of each circuit block within the IC is evident. Conventional timing models for circuit blocks generally include the items listed in Table 1.

TABLE 1

| Conventional Timing Modeling Scheme |
|---|
| 1. Input pin name and capacitance |
| 2. Output pin name |
| 3. Input pin's setup/hold time $S_{CLK\_in}$, $H_{CLK\_in}$ |
| 4. Output pin's output delay $D_{CLK\_in}$ |
| 5. Output pin's output resistance |

Each of these items provide timing information that characterizes the performance of the particular circuit block. While the terms "input pin" and "output pin" are used, it should be recognized that these do not necessarily refer to actual physical pins, but are merely points of entry or exit to for the custom circuit block. The input and output pins will generally be connected to other circuit blocks or input/output interfaces within the integrated circuit. It should be noted that the input pin's setup and hold time $S_{CLK\_in}$, $H_{CLK\_in}$ and the output pin's output delay time $D_{CLK\_in}$ values are determined with reference to the clock input signal, i.e., the amount of time in advance of and behind of the clock input signal necessary to provide for setup and hold. And the amount of delay time from the clock input signal to the output pin.

Circuitry within a circuit block can often be segmented between main circuitry and timing circuitry. The main circuitry performs the desired function of the circuit block, i.e., memory read/write, arithmetic, or other processing task. The timing circuit generally includes a clock buffer tree that receives an external clock signal and provides multiple clock signals as necessary to the main circuit. Clock signal lines passing from the timing circuit to the main circuit pass through what will be referred to herein as the clock reference point (CRP).

The input pin's setup/hold time and the output delay of the output pin may be determined by simulating the particular circuit block as a whole. This measures a signal delay from the clock input pin, through the CRP, to the signal output pin. For the setup/hold time, the timing difference between the clock input pin and the input signal pin is measured. Such simulations are based on computerized models of the circuitry within the circuit block. However, the criticality of the timing circuitry requires that it be very accurately modeled. Thus, building a schematic including of the timing circuitry can be laborious and time consuming. Furthermore, because of the complexity of the timing circuit, the simulation tends to take a great deal of time to run. This contrasts to the main circuitry, which tends to be repetitive, in the case of blocks providing memory functionality, or is otherwise simpler to model and simulate. Each time the clock circuit or main circuit is updated, the timing characterization for the entire block must be recalculated based on a new simulation for the modified block.

To reduce the complexity of modeling and simulating the clock circuitry, circuit blocks have also been modeled based on the worst-case specification number for timing of the entire IC to determine the clock signal delay of just the timing circuitry for the particular circuit block. Thus, in this case, the delay from the CRP to the input/output pins is estimated without real clock information. This allows the main circuit to be modeled from the CRP to the output pins, and the delay associated therewith to be simply added to the worst-case specification number. Clock buffer delay analysis is performed to assure that the clock delay from the clock input pin to the CRP meets the defined clock specification, and then for the timing analysis, the defined clock specification is used.

Since the worst case clock specification is used rather than one specific to the particular circuit block being modeled, the input pin's setup/hold time and the output delay estimates may be too conservative. This places an extra burden on designers to reduce the delay of the main logic circuit, which requires additional and possibly unnecessary engineering design time.

The known methods for assessing the timing parameters of custom circuit blocks has therefore not adequately addressed the need to provide accurate results in a timely manner.

SUMMARY OF THE INVENTION

Broadly speaking, the present invention fills these needs by providing a method and system using automation tools to separately model timing circuit of a custom circuit block. It should be appreciated that the present invention can be implemented in numerous ways, including as a process, an apparatus, a system, a device, or a method. Several inventive embodiments of the present invention are described below.

In accordance with a first aspect of the present invention, a method is provided for modeling timing characteristics of a circuit block of an integrated circuit, which includes a main circuit and a timing circuit. The method comprises determining an output pin output delay and determining a timing circuit delay. The output pin output delay is an interval of time from a clock signal reaching a clock reference point (CRP) to an output signal arriving at the output pin. The clock reference point is positioned between the timing circuit and the main circuit. The timing circuit delay is an interval of time from a clock signal arriving at a clock input pin to a clock signal arriving at the CRP. The determination of the timing circuit delay is based on a computer simulation of a netlist of circuit elements in the timing circuit.

In another embodiment, a method for modeling timing characteristics of a circuit block of an integrated circuit comprises determining an input pin's setup and hold time. The setup time is an interval of time beginning at a start of a setup of an incoming signal at an input pin of the circuit block and ending when a clock signal arrives at a CRP. The hold time is an interval of time beginning when a clock signal arrives at a CRP and ending at an end of the incoming signal at the input pin of the circuit block. The CRP is located at a point between a timing circuit portion of the circuit block and a main circuit portion of the circuit block.

In yet another embodiment, a method is provided for modeling the timing of a circuit block of an integrated circuit, wherein the circuit block comprises a timing circuit having a clock buffer tree and a main circuit. The method comprises: determining an input pin name and its capacitance, determining an output pin name, determining a setup and a hold time of the input pin, determining an output delay of the output pin, and determining a timing circuit delay of the timing circuit. The input pin receives data from a previous circuit block, the output pin providing output data, and the timing circuit delay of the timing circuit is based on a computer simulation of a netlist of circuit elements in the timing circuit.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1:
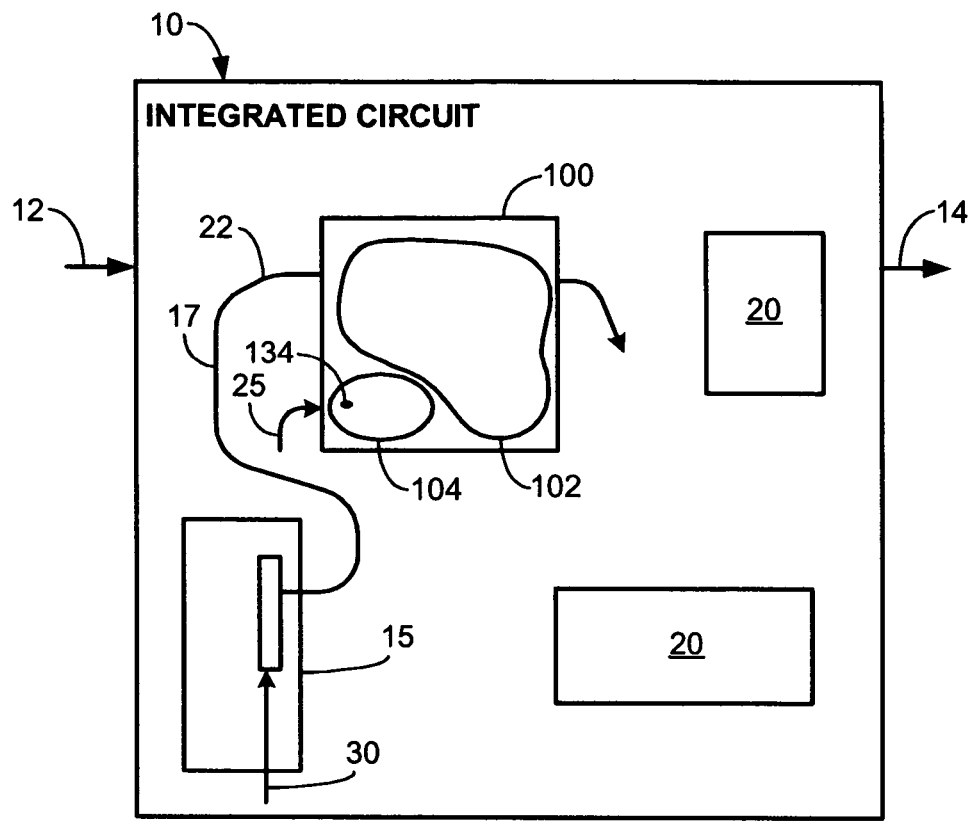
FIG. 1 shows an exemplary microprocessor layout having several circuit blocks positioned therein.

FIG. 1 shows an exemplary layout for an integrated circuit (IC) 10 that includes a circuit block 100, a previous circuit block 15, and any number of additional circuit blocks 20. IC 10 includes various inputs 12 and outputs 14 for receiving and providing various data, signals, etc. Interconnect 17 carries an input signal 22 to circuit block 100, which is also an output signal of previous circuit block 15. The signal provided by interconnect 17 may be data or other signal to be received by circuit block 100.

Figure 2:
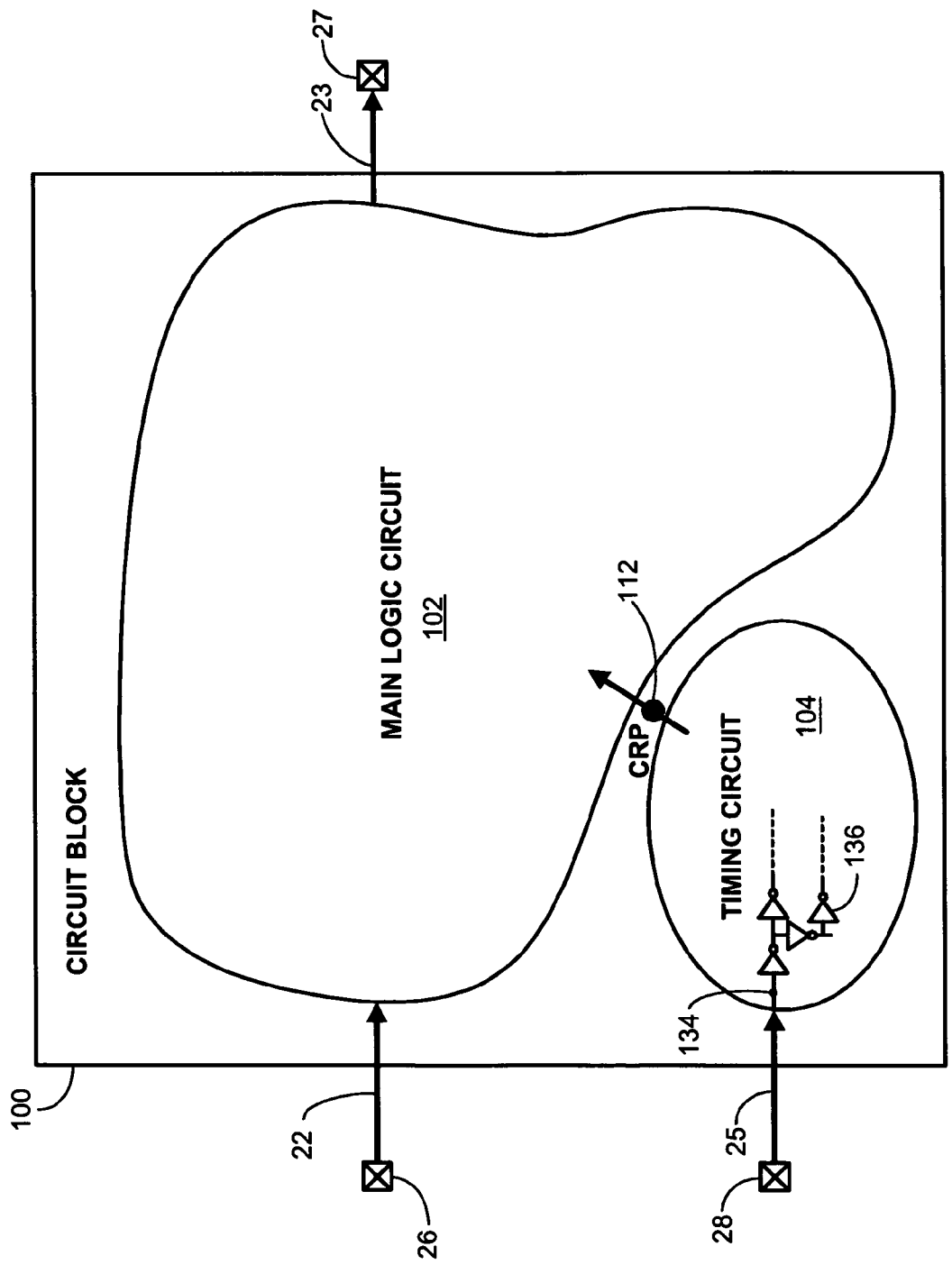
FIG. 2 shows an exemplary circuit block having main logic circuitry and timing circuitry thereon.

FIG. 2 shows a more detailed view of circuit block 100. Circuit block 100 performs some necessary task for IC 10. For example, custom circuit block 100 may provide memory functionality, e.g., a memory buffer, or may provide some other data processing or manipulation task, such as an arithmetic logic for performing various mathematical operations on input operands.

To perform the tasks required of custom circuit block 100, a variety of circuits are needed. These circuits may be generally classified as either part of main logic circuit 102 or of timing circuit 104. Main logic circuit 102 receives an input signal 22 from an input pin 26 and provides an output signal 23 at an output pin 27. Input signal 22 and output signal 23 are exemplary input and output signals, and circuit block 100 may in fact have numerous input signals and output signals. While the terms "input pin" and "output pin" are used, it should be recognized that these do not necessarily refer to actual physical pins, but are merely points of entry or exit to for the custom circuit block. Timing circuit 104 receives a clock signal 25 from clock input pin 28, and passes various clock signals to main logic circuit 102. A particular clock signal passing from timing circuit 104 to main logic circuit 102 passes through a clock reference point (CRP) 112.

According to one embodiment, certain timing parameters are determined which differ from the parameters determined for the prior art. The timing model's parameters are identified in Table 2 below:

TABLE 2

Timing Modeling Scheme

1. Input pin name and capacitance
2. Output pin name

TABLE 2-continued

Timing Modeling Scheme

Figure 3:
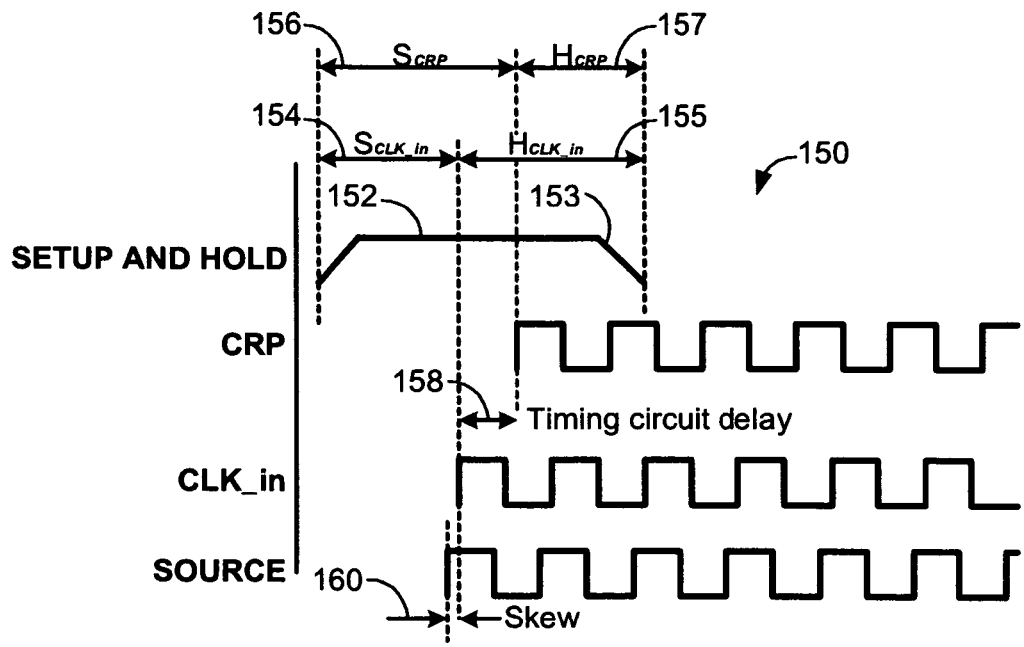
FIG. 3 shows an exemplary timing diagram illustrating certain timing intervals.

3. Input pin's setup/hold time $S_{CRP}$, $H_{CRP}$ (w.r.t CRP)
4. Output pin's output delay $D_{CRP}$ (w.r.t. CRP)
5. Output pin's output resistance
6. Timing circuit (clock buffer tree) delay
7. Clock buffer's coordinates The first two items of Table 2, the input pin name and capacitance and the output pin name, are determined in a known manner consistent with current practice. However, the input pin's setup and hold time $S_{CRP}$, $H_{CRP}$ is determined with respect to the clock signal at CRP 112, not clock input pin 28 as is the current practice. Thus, the input pin setup and hold time $S_{CRP}$, $H_{CRP}$ is established by modeling only the main logic circuitry. Referring to FIG. 3, a timing diagram 150 shows setup and hold 152, 153 for input signal 22 (FIG. 2). Previously, the setup and hold intervals were modeled with respect to clock input signal CLK_in as shown by setup and hold time intervals $S_{CLK\_in}$, 154, $H_{CLK\_in}$ 155 in FIG. 3. According to one embodiment, however, the setup and hold times are calculated with respect to CRP 112 (FIG. 2), as shown by setup and hold times $S_{CRP}$ 156, $H_{CRP}$ 157. Note that $S_{CLK\_in}$ interval 154 can be calculated by subtracting timing circuit delay interval 158 from $S_{CRP}$ 156 and that $H_{CLK\_in}$ interval 155 can be calculated by adding timing circuit delay interval 158 to $H_{CRP}$ 158. The timing circuit delay interval 158 is determined as described below.

As with the input pin setup time and the hold time, the output pin delay $D_{CRP}$ is determined from CRP 112 to the output pin 27 (FIG. 2). The setup and the hold time $S_{CRP}$, $H_{CRP}$ and output pin delay $D_{CRP}$ are determined by modeling the main logic circuitry using a netlist developed by hand in the known manner. The output pin's output resistance is likewise determined in the known manner by modeling main logic circuit 102.

Figure 4:
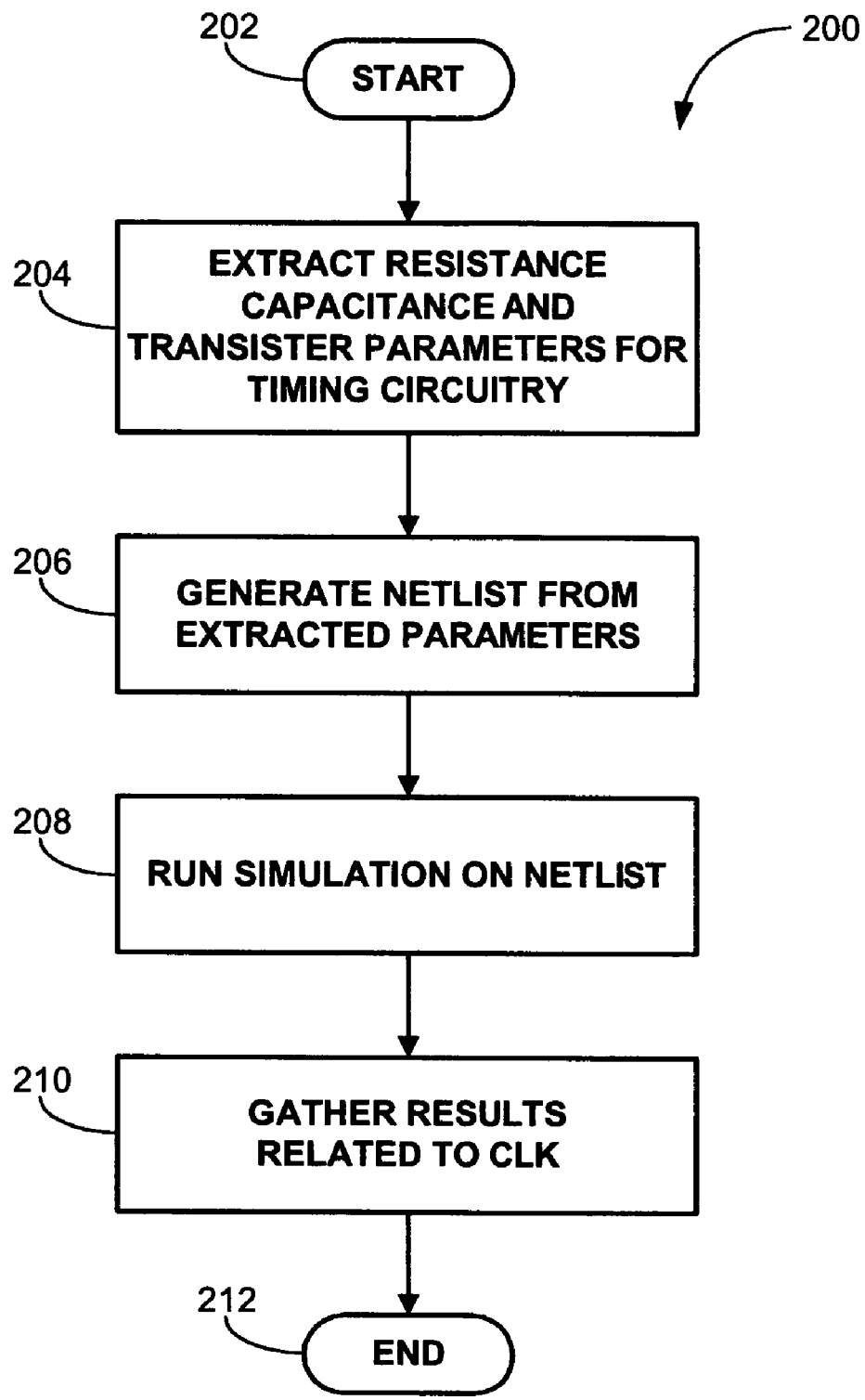
FIG. 4 shows a flow chart depicting an exemplary procedure for modeling a timing circuit.

The clock buffer tree delay is the time required for a signal to pass from the clock input pin 28 through timing circuit 104 to CRP 112. This delay is shown in FIG. 3 as interval 158. An exemplary procedure for modeling timing circuitry 104 is represented by flow chart 200 shown in FIG. 4. The procedure starts at starting block 202 and proceeds to operation 204 wherein resistance, capacitance, and transistor parameters, e.g., transistor size, are extracted for timing circuitry 104. These values are obtained from a layout file, which is a computer-readable file defining the structure of the circuit block, and specifically, the various circuit elements and interconnections. The physical parameters of the connections and circuit elements in the layout file provide the necessary information to determine the electrical parameters such as resistance, capacitance and transistor size.

After the circuit element characteristics are extracted, the procedure flows to operation 206 wherein a netlist is generated from the extracted parameters. Netlists are well understood in the art and generally contain instances of circuit elements and nets, and attributes thereof. The netlist may be generated by tracing the clock signal back from CRP 112 to clock input pin 28.

After the netlist is generated in operation 206, the procedure outlined by flowchart 200 flows to operation 208, wherein a simulation is run on the netlist. Software tools for simulating circuitry described by netlists are generally well known and available. The procedure then flows to operation 210 wherein the results related the clock signal are gathered. The procedure then ends as indicated by ending block 212.

The gathered results will provide the overall delay for a signal passing through timing circuit buffer tree 136 of timing circuit 104 from clock input pin 28 to CRP 112 (FIG. 2), shown as interval 158 in FIG. 3.

Finally, the x-y 134 coordinates of the input pin to the first clock buffer 134 of clock buffer tree 136 (FIG. 2) is determined. The coordinates may be determined in relation to the origin of circuit block 100, which may be located at one of the corners of circuit block 100, e.g., the lower left corner. The location of the first clock buffer allows one to determine a distance from the first clock buffer of previous block 15 to the first clock buffer 134 of circuit block 100 (FIG. 1). This relates to the skew 160 (FIG. 3) seen by the circuit block as a whole. Referring to FIG. 1, suppose input signal 22 originates from previous block 15. Ideally, previous block 15 having a clock input signal 30 will be perfectly synchronized with clock input signal 25. However, due to the distance between clock input 25 (FIG. 2) and clock signal 30, there will be a slight delay, causing skew 160 shown in FIG. 3. The skew can be estimated based on the distance between the input pin of the first clock buffer 134 and the input pin of the first clock buffer in previous block 15. For example, a table based on empirical or theoretical basis might determine a 2 pico-second skew for 100 micrometer distance.

Once the above-mentioned timing model parameters are determined, they may be input into existing analysis tools for validating the entire IC to make sure that there are no critical paths in the IC.

Developing a timing model of the circuit block takes less time than with previous modeling schemes, and saves additional time and expense by providing more accurate results. Because the timing circuitry characterization is automated, accurate results are provided for the timing circuitry without the detailed laborious manual characterizations. This reduces the overall time it takes to characterize the circuit block since it no longer is required to include the timing circuitry.

In addition, the timing circuitry may still be in design phase when work can begin on modeling the main logic circuitry. Furthermore, the timing model characterization and simulation does not have to be performed again for timing circuitry after changes are made to the main logic circuitry, and vice versa.

Furthermore, since the timing circuitry and the main logic circuitry are separately characterized, different process, voltage, and temperature (PVT) factors can be used. The PVT process factor provides a margin for error to account for manufacturing (process) and environmental variations. Applying a different PVT process factor to the main logic circuitry and timing circuitry allows more efficient use of engineering time to reduce tolerances on the more critical timing circuitry while allowing looser tolerances (having a larger PVT value) for the main logic circuitry.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention, or portions thereof, can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Embodiments of the present invention can be processed on a single computer, or using multiple computers or computer components which are interconnected. A computer, as used herein, shall include a standalone computer system having its own processor(s), its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for modeling timing characteristics of a circuit block of a design for an integrated circuit, the circuit block having a main circuit and a timing circuit, the method comprising:
   determining an output delay, the output delay being an interval of time from a clock signal reaching a clock reference point (CRP) to an output signal arriving at an output pin of the main circuit, the CRP being positioned between the timing circuit and the main circuit;
   determining a timing circuit delay, the timing circuit delay being an interval of time from a clock signal arriving at a clock input pin to a clock signal arriving at the CRP, the clock input pin being an input pin to the timing circuit, and the determining of the timing circuit delay being based on a computer simulation of a netlist of circuit elements in the timing circuit; and
   identifying whether there are any critical paths by separately modeling the timing circuit and the main circuit, and improving the design when the critical paths are identified.

2. The method of claim 1 wherein the netlist includes only circuit elements of the timing circuit.

3. The method of claim 1, wherein the determining the timing circuit delay further comprises automatically extracting circuit parameters for circuit elements in the timing circuit, and automatically generating the netlist from the extracted circuit parameters.

4. The method of claim 3, wherein the extracted circuit parameters include resistance, capacitance, and transistor size of circuit elements in the timing circuit.

5. The method of claim 3, further comprising gathering results of the simulation related to the clock signal, wherein the timing circuit delay from the clock input pin to the CRP is calculated based on the simulation.

6. The method of claim 1, further comprising:
   determining a setup time and a hold time, the setup time being an interval of time beginning at a start of a setup of an incoming signal at an input pin of the main circuit, and ending when the clock signal arrives at the CRP, the hold time being an interval of time beginning when the clock signal arrives at the CRP and ending at an end of the incoming signal at the input pin.

7. The method of claim 1 further comprising:
   determining coordinates of a first buffer of a buffer tree in the timing circuit, and
   estimating a skew of a clock signal based on a distance from the coordinates to a clock input location for a previous circuit block.

8. The method of claim 1 further comprising:
   applying a first process, voltage, and temperature (PVT) factor to the timing circuit; and
   applying a second PVT factor to the main circuit, the first PVT factor being different than the second PVT factor.

9. A method for modeling timing characteristics of a circuit block of an integrated circuit design, the circuit block having a main circuit portion and a timing circuit portion, the method comprising:
   determining an input pin's setup time and hold time, the setup time being an interval of time beginning at a start of a setup of an incoming data signal at an input pin of the main circuit portion of the circuit block, and ending when a clock signal arrives at a clock reference point (CRP), the hold time being an interval of time beginning when the clock signal arrives at the CRP, and ending at an end of the incoming data signal at the input pin, the CRP being at a point between the timing circuit portion of the circuit block and the main circuit portion of the circuit block; and
   identifying whether there are any critical paths by separately modeling the timing circuit portion and the main circuit portion; and improving the design if the critical paths are identified.

10. The method of claim 9 further comprising:
    determining a timing circuit delay, the timing circuit delay being an interval of time from a clock signal arriving at a clock input pin of the circuit block to a clock signal arriving at the CRP, the determining the timing circuit delay being based on a computer simulation of a netlist of circuit elements in the timing circuit, the timing circuit being defined as circuitry interposed between the clock input pin and the CRP.

11. The method of claim 10 wherein the netlist includes only circuit elements of the timing circuit.

12. A method for modeling a timing of a circuit block of an integrated circuit, the circuit block comprising a timing circuit having a clock buffer tree and a main circuit design, a clock reference point (CRP) being positioned between the timing circuit and the main circuit, the method comprising:
- determining an input pin name and capacitance of an input pin of the main circuit, the input pin receiving data from a previous circuit block;
- determining an output pin name of an output pin of the main circuit, the output pin providing output data;
- determining a setup time and a hold time of the input pin;
- determining an output delay of the output pin, the output delay being a signal delay from the CRP to the output pin;
- determining a timing circuit delay of the timing circuit, the timing circuit delay being a signal delay from a clock signal input pin and the CRP; and
- identifying whether there are any critical paths by separately modeling the timing circuit and the main circuit; and improving the design if the critical paths are identified.

13. The method of claim 12, wherein the setup time is an interval of time beginning at a start of a setup of an incoming signal at the input pin, and ending when a clock signal arrives at a clock reference point CRP; the hold time is an interval of time beginning when the clock signal arrives at the CRP and ending at an end of the incoming signal at the input pin.

14. The method of claim 12 wherein the output delay of the output pin is determined by developing a netlist of circuit elements in the main circuit and running a simulation on the netlist.

15. The method of claim 12 wherein the determining the timing circuit delay is based on a computer simulation of a netlist of circuit elements in the timing circuit, the timing circuit being defined as circuitry interposed between the clock input pin and the CRP.

16. The method of claim 15 wherein the netlist includes only items relating to the timing circuit.

17. The method of claim 12, further comprising determining coordinates of a first buffer of a buffer tree in the timing circuit and estimating a skew of a clock signal based on a distance from the coordinates to a clock input location for a previous circuit block.

18. The method of claim 12 further comprising:
- applying a first process, voltage, and temperature (PVT) factor to the timing circuit; and
- applying a second PVT factor to the main circuit, the first PVT factor being different than the second PVT factor.

* * * * *